United States Patent
Wu (10) Patent No.: US 6,482,744 B1
(45) Date of Patent: Nov. 19, 2002

(54) TWO STEP PLASMA ETCH USING VARIABLE ELECTRODE SPACING

(75) Inventor: Chao-chueh Wu, Hsinchu (TW)

(73) Assignee: Promos Technologies, Inc., Hsinchu (TW)

(*) Notice: Subject to any disclaimer, the term of this patent is extended or adjusted under 35 U.S.C. 154(b) by 0 days.

(21) Appl. No.: 09/640,488

(22) Filed: Aug. 16, 2000

(51) Int. Cl.⁷ .............................................. H01L 21/311
(52) U.S. Cl. ...................... 438/700; 438/706; 438/714; 438/716; 438/723
(58) Field of Search .................. 438/700, 706, 438/709, 710, 712, 714, 715, 716, 723

(56) References Cited

U.S. PATENT DOCUMENTS 5,227,337 A * 7/1993 Kadomura ................ 437/192
5,920,796 A * 7/1999 Wang et al. ............... 438/700
6,069,092 A * 5/2000 Imai et al. ................ 438/723
6,071,797 A * 6/2000 Endo et al. ............... 438/488
6,199,561 B1 * 3/2001 Mitsuhashi ................ 134/1.1
6,235,640 B1 * 5/2001 Ebel et al. ................. 438/706

* cited by examiner

Primary Examiner—Benjamin L. Utech
Assistant Examiner—Duy-Vu Deo
(74) Attorney, Agent, or Firm—Blakely Sokoloff Taylor & Zafman LLP (57) ABSTRACT

A method of etching in a plasma etching chamber having an upper electrode and a susceptor is disclosed. The method comprises: setting the upper electrode and the susceptor to a first predetermined distance; performing a first etch at the first predetermined distance for a first predetermined time; setting the upper electrode and the susceptor to a second predetermined distance; and performing a first etch at the second predetermined distance for a second predetermined time.

8 Claims, 7 Drawing Sheets

TWO STEP PLASMA ETCH USING VARIABLE ELECTRODE SPACING

FILED OF THE INVENTION

The present invention relates to etching, and more specifically, to a method of etching using variable electrode spacing.

BACKGROUND OF THE INVENTION

Etching in semiconductor processing has inherent limitations. An ideal anisotropic etch leaves vertical walls in the resist and metal layers. However, because the etching chemical dissolves the top of the wall for a longer time than the bottom, the resulting hole is wider at the top than at the bottom. Hence, the etch is somewhat isotropic.

Dry etching processes, such as reactive ion etching, have decreased this problem. Dry etch techniques rely in part on material from the masking layer (usually photoresist) to achieve anisotropic profiles. This has the undesirable side effect of making the etch anisotropically sensitive to masking pattern density.

Another difficulty with prior etching techniques is that the etching varies over the surface of the wafer. In other words, certain portions of the wafer are over etched, while other portions of the wafer are under etched. The above are merely examples of etching limitations.

The etching process is performed in an etching tool, such as the tools manufactured by Tokyo Electron Ltd. (TEL) of Tokyo, Japan. TEL manufactures a dipole ring magnetron (DRM) etching tool called the Unity DRM. This tool is described in U.S. Pat. No. 6,014,943 to Arami et al. In the Unity DRM etching tool, a semiconductor wafer is subjected to a plasma atmosphere which is generated by introducing a process gas into a process vessel and converting the process gas into a plasma-state gas.

In recent years, the degree of integration of semiconductor devices has been increased and critical dimensions have decreased. One of the more difficult etching problems is evenly etching contact vias for connection to a bitline of a DRAM memory array, particularly over the entire surface of the wafer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

SUMMARY OF THE INVENTION

A method of etching in a plasma etching chamber having an upper electrode and a susceptor is disclosed. The method comprises: setting the upper electrode and the susceptor to a first predetermined distance; performing a first etch at the first predetermined distance for a first predetermined time; setting the upper electrode and the susceptor to a second predetermined distance; and performing a first etch at the second predetermined distance for a second predetermined time.

DETAILED DESCRIPTION

Figure 1:
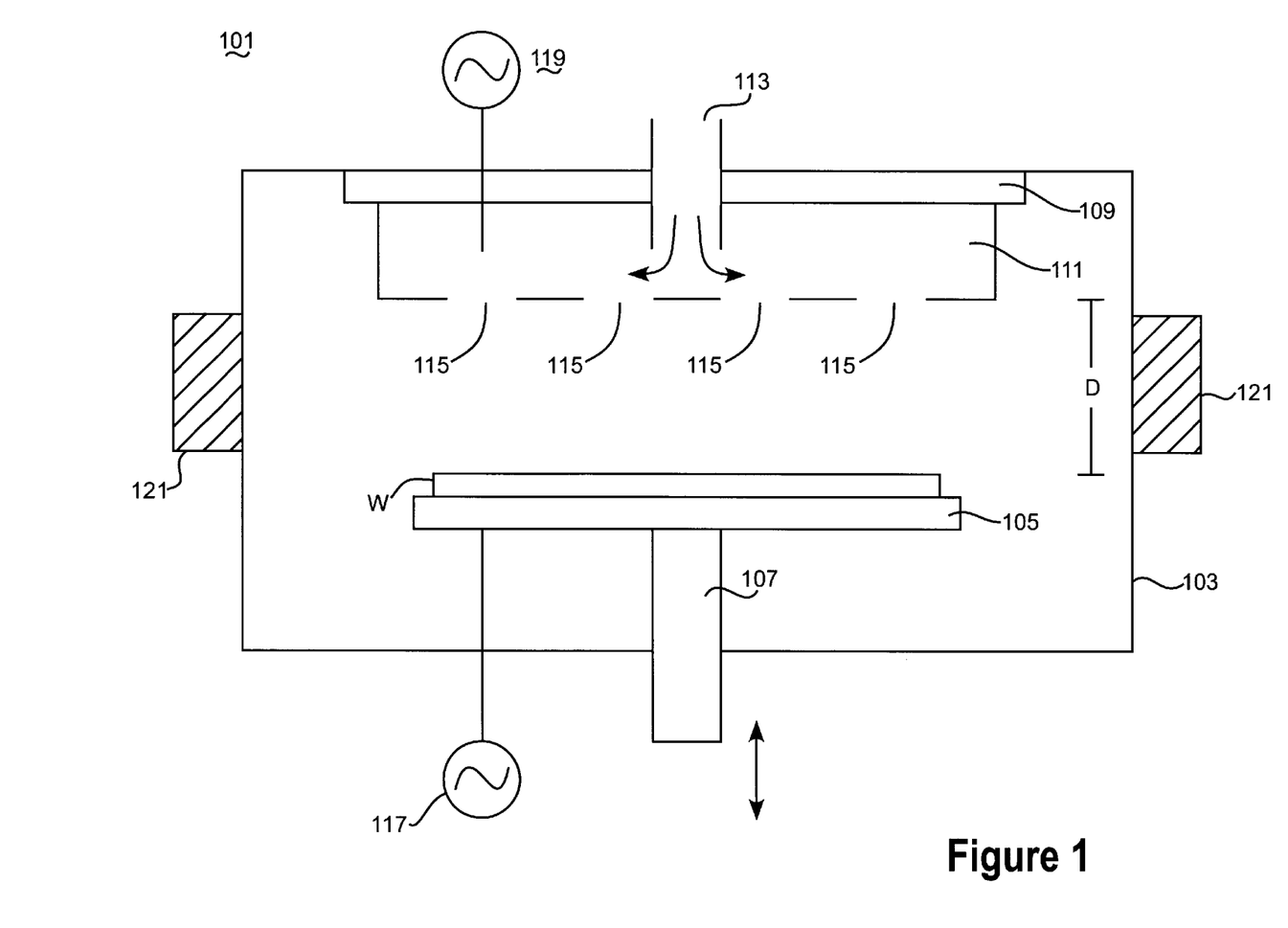
FIG. 1 is a schematic diagram of a plasma etching chamber used in connection with the present invention.

Turning to FIG. 1, a plasma etching apparatus 101 is shown. The chamber 101 includes a cylindrical process vessel 103 made of a metal e.g., an anodized aluminum. The process chamber 103 can be opened or closed airtight. The process chamber 103 itself is grounded, for example, by connecting to a ground line.

In the bottom of the process chamber 103, a cylindrical susceptor 105 for mounting a semiconductor wafer W thereon, is provided coaxially with the process vessel 103. The susceptor 105, whose surface is formed of anodized aluminum, serves as a lower electrode. The susceptor 105 is supported by a support pole 107. The bottom end of the support pole 107 projects outwardly from the bottom wall of the process vessel 103. The support pole 107 can move vertically (as indicated by a double-headed arrow in FIG. 1) under the control of a driving source (e.g., a motor) provided outside of the process vessel 103.

FIG. 1 shows the position of the susceptor 105 during etching. When the wafer W is loaded/unloaded, the susceptor 105 is descended to low position. On the susceptor 105 is an electrostatic chuck (not shown) for holding the wafer W. The wafer W is disposed in a predetermined position on the electrostatic chuck.

A circular opening is provided in the center of the upper wall of the process. chamber 103. In the periphery of the circular opening, a non-conductive ring 109 made of alumina or the like is set. Attached to the ring 109 is an upper electrode 111 positioned to face the susceptor 105 and thus the wafer W mounted thereon with a predetermined distance D apart from the wafer W. The entire upper electrode 111 of this preferable embodiment is made of a conductive material such as surface-anodized aluminum.

The upper electrode 111 has a hollow portion to which gas may be introduced through a gas inlet 113. In the lower wall of the upper electrode 111, a number of gas-emitting holes 115 are formed with a predetermined distribution, for supplying a process gas above the entire wafer surface W uniformly.

In this embodiment, a predetermined process gas, for example, a CF series etching gas such as a $CF_4$ gas or a $C_4F_8$ gas is supplied. The etching gas is emitted from the gas-emitting holes 115 of the upper electrode 111, at a controllable flow rate, and supplied uniformly to the wafer W. In other words, the gas is supplied into the plasma generation space between the susceptor 105 and the upper electrode 11.

Further, a first high frequency power source 117 is used for generating a high frequency power having a frequency of several hundreds kHz, e.g., 800 kHz. The first high frequency power source 117 is connected to the susceptor 105 (the lower electrode). Also, a second high frequency power source 119 is connected to the upper electrode 111. The second high frequency power source 119 is used for generating a high frequency power having a frequency of, e.g., 27.12 MHz which is higher than that of the first high frequency power source 117. Finally, along the periphery of the process vessel 103, a dipole ring magnet 121 is provided as a magnetic-field generation means.

It should be appreciated that other elements of the plasma etching apparatus 101 have not been described for simplicity. However, those of ordinary skill in the art will recognize that elements used for controlling temperature, pressure, gas flow rate, frequency, and power are all commonly used in such apparatus. For purposes of the present invention, the spacing D between the susceptor 105 and the upper electrode 111 is of primary interest.

In accordance with the present invention, and in contrast to the prior art, the spacing D is varied during an etching process. It has been found that using the variable electrode spacing technique, improved uniformity in etching can be achieved. Specifically, the plasma distribution during etching will be affected by the electrode gap. If the gap is larger, the etching rate in the center part of the wafer will be faster than at the edge. Further, if the gap is made smaller, the etching rate in the edge of the wafer will be higher than in the center.

In a conventional method, the gap is made relatively large and etching time is increased to ensure that the etching is complete in the peripheral regions of the wafer. However, this may result in overetching in the central portion of the wafer.

Figure 2:
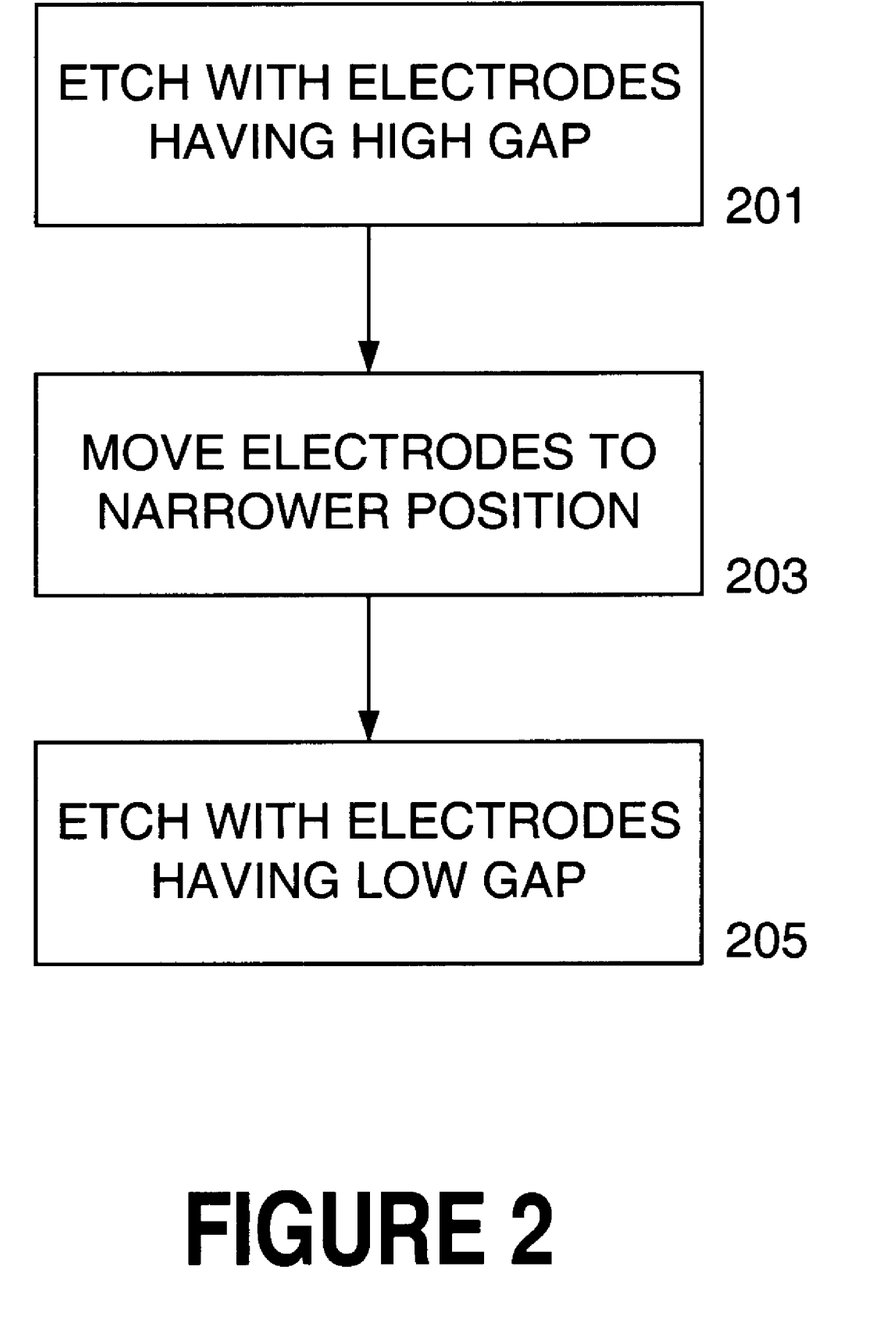
FIG. 2 is a flow diagram illustrating the process of the present invention.

Thus, turning to FIG. 2, an etching process begins at box 201 with the susceptor 105 and upper electrode 111 having a large spacing D. The etching process continues for a predetermined amount of time, and at box 203, the susceptor 105 and upper electrode 111 are moved to have a narrower spacing D. Finally, at box 205, the etching continues with the narrower spacing D for a second predetermined amount of time.

In an alternative embodiment, the first etching is performed using a narrow spacing D and the second etching is performed using a wider spacing D. Thus, the order by which the etching is done is not crucial, but important consideration is that by adjusting the spacing D, improved results can be obtained.

In accordance with one actual embodiment, using the Unity DRM apparatus, the maximum spacing D is 37 millimeters and the minimum spacing D is 27 millimeters. In the prior art, the spacing D is typically on the order of 30–32 millimeters for optimal etching. In the prior art, for etching of about 7000 to 9000 angstroms of oxide to form a contact via to the bitline of a DRAM, the spacing D is set at 32 millimeters and the etching is performed for 75 seconds.

Specifically, as seen in FIGS. 3–7, the process of etching a bitline contact comprises the etching of an anti-reflective coating (ARC), a first self-aligned contact (SAC) oxide etch (SAC1 etch), a second SAC oxide etch (SAC2), and a liner oxide etch.

Figure 3:
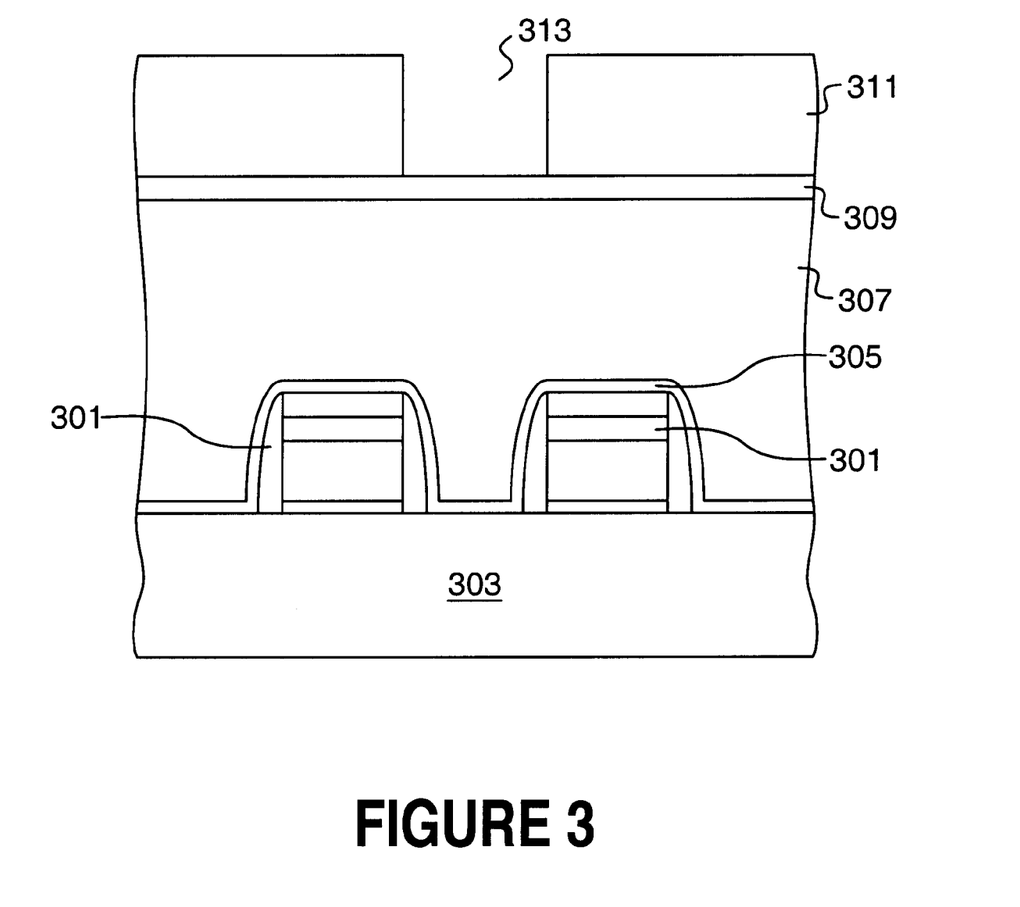
FIGS. 3–7 illustrate how the method of the present invention can be used to etch a bitline contact in a DRAM memory cell.

Turning to FIG. 3, a typical cross section of a DRAM memory cell is shown. A gate stack 301 is formed on a semiconductor substrate 303. Typically, the gate stack is a composite of a thin oxide layer, a polysilicon layer, and a silicide layer. Formed over the two gate stacks 301 is a liner oxide layer 305. Over the liner oxide layer 305 is a bulk oxide layer 307 that can be formed from borophosphosilicate glass (BPSG) or tetraorthoethlysilicate (TEOS). Next, formed over the bulk oxide layer is an anti-reflective coating (ARC) layer 309. Finally, in order to form the bitline contact that extends down between the two gate stacks 301 to the substrate 303, a photoresist layer 311 is deposited and patterned over the ARC 309 to include a bitline opening 313. The photoresist layer 311 is used as an etching mask. The foregoing steps are conventional in the prior art.

Figure 4:
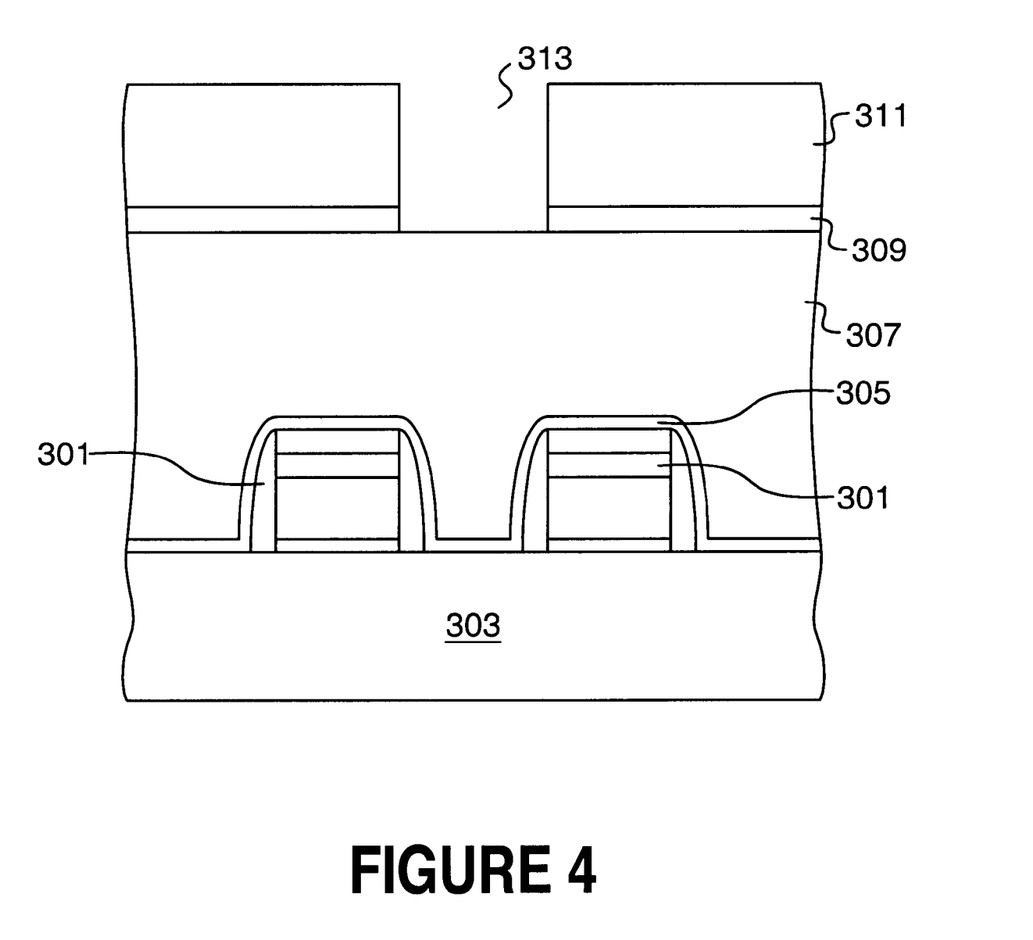

Next, an etching step is performed to remove that portion of the ARC 309 that is exposed by the photoresist layer 311. In the preferred embodiment using the Unity DRM apparatus, the etch is performed at a pressure of 60 millitorr, a power of 1400 watts, and a gap of 32 millimeters for 40 seconds. Also, the gases used are $CF_4$ flowed at 80 sccm, $O_2$ flowed at 20 sccm, and Ar flowed at 100 sccm. After the etch, the resulting structure is shown in FIG. 4.

Next, a first part of the SAC1 etch is performed. During the first part of the SAC1 etch, the etch is performed at a pressure of 53 millitorr, a power of 1500 watts, and a gap spacing D of 37 millimeters for between 30 and 40 seconds. Also, the gases used are $C_4F_8$ flowed at 12 sccm, CO flowed at 250 sccm, and Ar flowed at 285 sccm.

Figure 5:
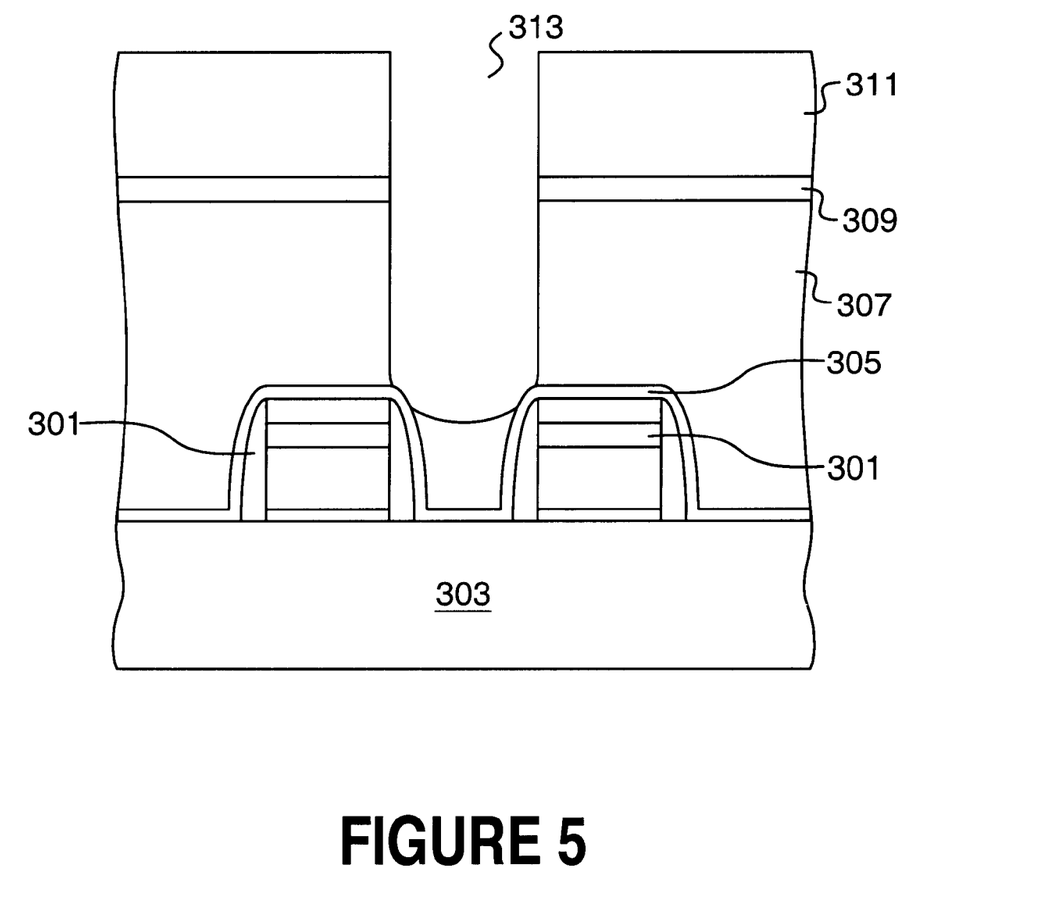

Next, a second part of the SAC1 etch is performed with the spacing D at 27 millimeters for between 40 and 35 seconds. Similarly, during the second portion of the SAC1 etch, the etch is performed at a pressure of 53 millitorr and a power of 1500 watts. Also, the gases used are $C_4F_8$ flowed at 12 sccm, CO flowed at 250 sccm, and Ar flowed at 285 sccm. The resulting structure is shown in FIG. 5.

Figure 6:
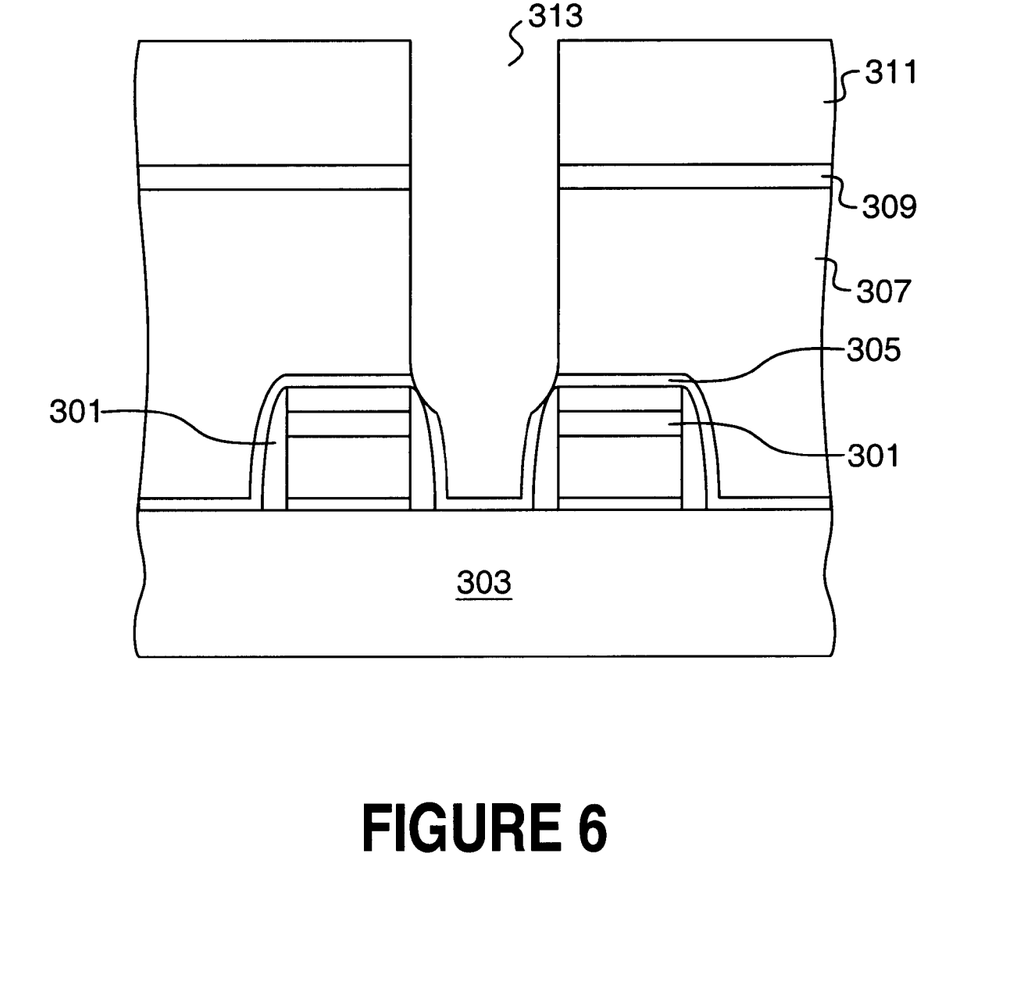

Next, the SAC2 etch is performed to removing the remaining bulk oxide between the gate stacks 301. Preferably, the SAC2 etch is performed at a pressure of 53 millitorr, a power of 1500 watts, and a gap spacing D of 32 millimeters for about 20 seconds. Also, the gases used are $C_4F_8$ flowed at 10 sccm, CO flowed at 250 sccm, Ar flowed at 250 sccm, and $O_2$ flowed at 2 sccm. The resulting structure is shown in FIG. 6.

Figure 7:
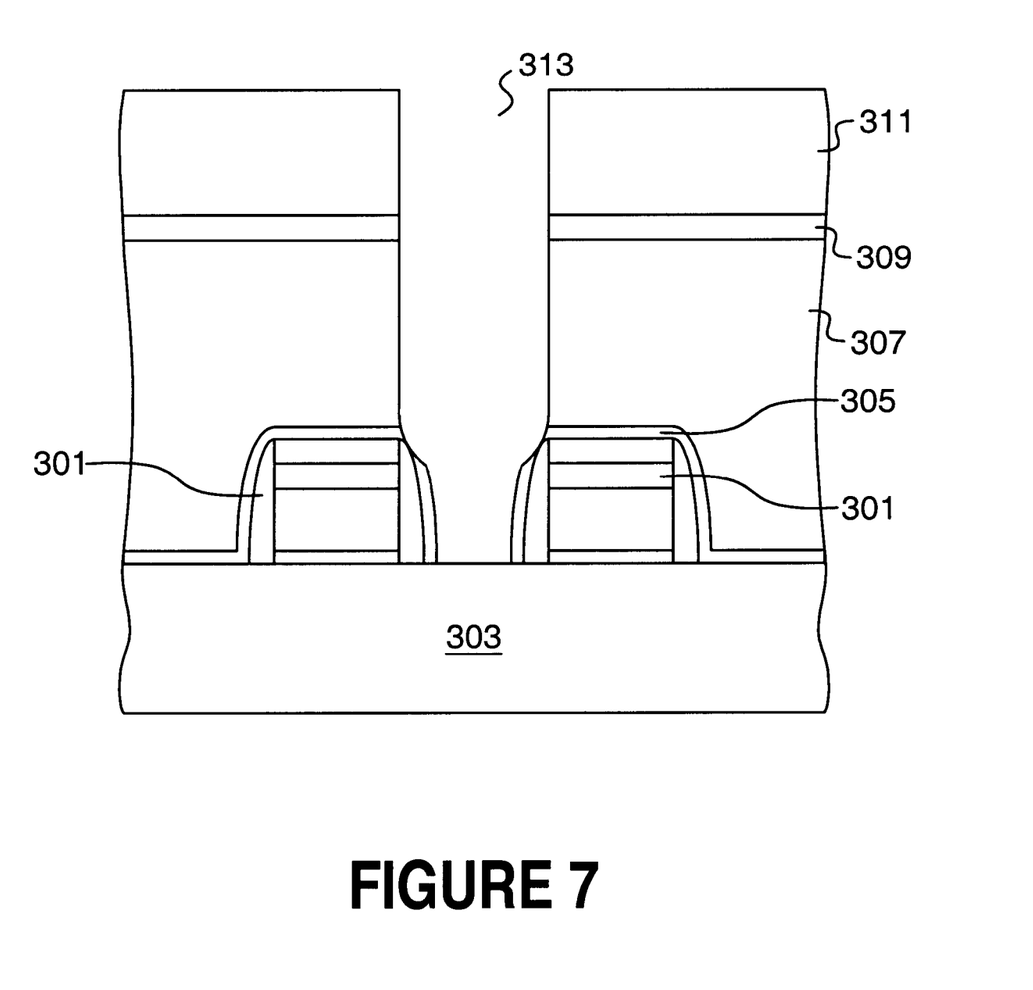

Finally, the liner etch is performed to remove the liner oxide 305 between the gate stacks 301. Preferably, the liner etch is performed at a pressure of 50 millitorr, a power of 500 watts, and a gap spacing D of 32 millimeters for about 10 seconds. Also, the gases used are $CHF_3$ flowed at 30 sccm and $O_2$ flowed at 30 sccm. The resulting structure is shown in FIG. 7.

While the preferred embodiment of the invention has been illustrated and described, it will be appreciated that various changes can be made therein without departing from the spirit and scope of the invention. For example, although a specific etching recipe is described in connection with a bitline contact etch, the present invention may be used with any etching process that requires uniform etching over the entire surface of the wafer.

What is claimed is:

1. A method of etching a contact hole to a bitline, said contact hole being defined by a photoresist pattern formed atop of an anti-reflective coating, a bulk oxide layer, and a liner oxide layer, said etching performed in a plasma etching chamber having an upper electrode and a susceptor, said method comprising:

etching away said anti-reflective coating;

performing a first etch of said bulk oxide layer, said first etch performed with said upper electrode and said susceptor set to a first distance;

performing a second etch of said bulk oxide layer, said second etch performed with said upper electrode and said susceptor set to a second distance;

performing a third etch of said bulk oxide layer, said third etch performed with said upper electrode and said susceptor set to a third distance; and etching away said an exposed portion of said liner oxide.

2. The method of claim 1 wherein said first gap distance is greater than said second gap distance.

3. The method of claim 1 wherein said first gap distance is less than said second gap distance.

4. The method of claim 1 wherein said first gap distance is the maximum spacing of said susceptor and said upper electrode for said plasma etch apparatus.

5. The method of claim 1 wherein said third gap distance is between said first and second gap distances.

6. The method of claim 1 wherein said first gap distance is 37 mm, said second gap distance is 27 mm, and said third gap distance is 32 mm.

7. The method of claim 1 wherein said first gap distance is the maximum allowed by said plasma etching chamber and said second gap distance is the minimum allowed by said plasma etching chamber.

8. The method of claim 1 wherein said first gap distance is the minimum allowed by said plasma etching chamber and said second gap distance is the maximum allowed by said plasma etching chamber.

* * * * *

UNITED STATES PATENT AND TRADEMARK OFFICE
CERTIFICATE OF CORRECTION

PATENT NO.   : 6,482,744 B1
DATED        : November 19, 2002
INVENTOR(S)  : Wu

It is certified that error appears in the above-identified patent and that said Letters Patent is hereby corrected as shown below:

<u>Title page,</u>
*Assistant Examiner*, please delete "Duy-Vu Deo" and insert -- Duy Vu n Deo --.

Signed and Sealed this

Twelfth Day of August, 2003

JAMES E. ROGAN
*Director of the United States Patent and Trademark Office*